(12) United States Patent
Lee

(10) Patent No.: US 11,975,506 B2
(45) Date of Patent: May 7, 2024

(54) DISPLAY DEVICE AND MANUFACTURING METHOD OF BASE FILM

(71) Applicant: Samsung Display Co., Ltd., Yongin-si (KR)

(72) Inventor: Jung Hun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 83 days.

(21) Appl. No.: 16/227,231

(22) Filed: Dec. 20, 2018

(65) Prior Publication Data

US 2019/0232616 A1 Aug. 1, 2019

(30) Foreign Application Priority Data

Feb. 1, 2018 (KR) .................. 10-2018-0012946

(51) Int. Cl.
*B32B 15/08* (2006.01)
*B32B 37/06* (2006.01)
(Continued)

(52) U.S. Cl.
CPC .............. *B32B 15/08* (2013.01); *B32B 37/06* (2013.01); *G02F 1/133305* (2013.01);
(Continued)

(58) Field of Classification Search
CPC ......... B32B 15/08; B32B 37/06; B32B 37/10; B32B 2457/202; B32B 2457/206; B32B 2037/0092; B32B 2457/20; B32B 7/10; B32B 27/281; B32B 27/288; H01L 51/5256; H01L 51/0097; H01L 51/5243; H01L 2251/55; H01L 27/3244; H01L 27/1214; G02F 1/133305; G02F 1/1368; G02F 1/133723; G02F 1/1333; G02F 2201/50; C09K 2323/06; C09K 2323/061; B29C 45/1657; Y02E 10/579; G09F 9/301; Y02P 70/50

See application file for complete search history.

(56) References Cited

U.S. PATENT DOCUMENTS 5,667,851 A * 9/1997 Edman ................ C08K 5/57
204/471
6,284,329 B1 * 9/2001 Matienzo ............ B32B 7/12
427/539

(Continued)

FOREIGN PATENT DOCUMENTS

CN 104022125 9/2014
CN 104064691 9/2014

(Continued)

OTHER PUBLICATIONS

Extended EP Search Report for European Application No. 19155119, dated Apr. 12, 2019.

*Primary Examiner* — Eli D. Strah
(74) *Attorney, Agent, or Firm* — KILE PARK REED & HOUTTEMAN PLLC

(57) ABSTRACT

A display device includes a display panel including a substrate and a base film positioned on one surface of the display panel. The base film includes a first layer and a second layer overlapping each other, and a metal layer positioned between the first layer and the second layer. A modulus of each of the first layer and the second layer is 1 GPa to 10 GPa.

20 Claims, 11 Drawing Sheets

(51) Int. Cl.
  *G02F 1/1333* (2006.01)
  *H01L 51/00* (2006.01)
  *H10K 50/844* (2023.01)
  *H10K 77/10* (2023.01)
  *B29C 45/16* (2006.01)
  *B32B 37/00* (2006.01)
  *G02F 1/1368* (2006.01)
  *H01L 27/12* (2006.01)
  *H10K 59/12* (2023.01)
  *H10K 101/00* (2023.01)

(52) U.S. Cl.
  CPC ....... *H10K 50/8445* (2023.02); *H10K 77/111* (2023.02); *B29C 45/1657* (2013.01); *B32B 2037/0092* (2013.01); *B32B 2457/202* (2013.01); *B32B 2457/206* (2013.01); *C09K 2323/06* (2020.08); *C09K 2323/061* (2020.08); *G02F 1/1368* (2013.01); *G02F 2201/50* (2013.01); *H01L 27/1214* (2013.01); *H10K 59/12* (2023.02); *H10K 2101/00* (2023.02)

(56) References Cited

U.S. PATENT DOCUMENTS

| | | |
|---|---|---|
| 8,221,889 B2 | 7/2012 | Lee et al. |
| 9,178,178 B2 | 11/2015 | Lee et al. |
| 9,419,243 B2 | 8/2016 | Park et al. |
| 9,947,726 B2 | 4/2018 | Lee |
| 10,170,505 B2 | 1/2019 | Lee et al. |
| 10,285,278 B2 | 5/2019 | Namkung et al. |
| 10,347,700 B2 | 7/2019 | Yang et al. |
| 10,608,024 B2 | 3/2020 | Lee et al. |
| 10,644,074 B2 | 5/2020 | Leng et al. |
| 11,075,251 B2 | 7/2021 | Yang et al. |
| 2011/0311789 A1* | 12/2011 | Loy ........................ H05K 3/007 428/198 |
| 2012/0187399 A1 | 7/2012 | Fukuda et al. |
| 2014/0285914 A1 | 9/2014 | Sakano et al. |
| 2014/0339517 A1 | 11/2014 | Park et al. |
| 2015/0077953 A1* | 3/2015 | Namkung ............... H05K 3/28 361/751 |
| 2015/0102324 A1 | 4/2015 | Lee |
| 2015/0201487 A1 | 7/2015 | Kee et al. |
| 2016/0190522 A1* | 6/2016 | Lee ..................... H01L 27/3276 257/40 |
| 2017/0352834 A1* | 12/2017 | Kim ................... H01L 27/3276 |
| 2018/0258332 A1* | 9/2018 | Song ......................... B32B 7/12 |
| 2020/0061972 A1* | 2/2020 | Ha .......................... B32B 15/08 |
| 2022/0020825 A1 | 1/2022 | Yang et al. |

FOREIGN PATENT DOCUMENTS

| | | | | |
|---|---|---|---|---|
| CN | 203910803 | | 10/2014 | |
| CN | 104464517 | | 3/2015 | |
| CN | 106910823 | | 6/2017 | |
| CN | 107230693 | | 10/2017 | |
| CN | 107464800 | | 12/2017 | |
| JP | 07-299883 A | | 11/1995 | |
| JP | 3683612 B2 | | 8/2005 | |
| JP | 2010-156022 | | 7/2010 | |
| JP | 2016-106363 A | | 6/2016 | |
| JP | 2017-1390 | | 1/2017 | |
| JP | 2017001390 A | * | 1/2017 | |
| KR | 10-2015-0084260 A | | 7/2015 | |
| KR | 10-2016-0128649 | | 11/2016 | |
| KR | 10-2016-0130876 A | | 11/2016 | |
| KR | 10-2017-0001819 | | 1/2017 | |
| TW | 200937586 | | 9/2009 | |
| WO | WO-2009075396 A1 | * | 6/2009 | ........... B32B 15/043 |
| WO | 2017-082654 | | 5/2017 | |
| WO | WO-2017082654 A1 | * | 5/2017 | ............. B32B 27/08 |

\* cited by examiner

DISPLAY DEVICE AND MANUFACTURING METHOD OF BASE FILM

CROSS-REFERENCE TO RELATED APPLICATION

Korean Patent Application No. 10-2018-0012946 filed on Feb. 1, 2018, in the Korean Intellectual Property Office, and entitled: "Display Device and Manufacturing Method of Base Film," is incorporated by reference herein in its entirety.

BACKGROUND

1. Field

Embodiments relate to a display device and a manufacturing method of a base film included in the display device.

2. Description of the Related Art

A liquid crystal display (LCD), an organic light emitting diode (OLED) display, etc., may be used as a display device. To apply these display devices to various applications, a flexible display device that can be easily bent has been developed.

SUMMARY

Embodiments are directed to a display device including a display panel including a substrate and a base film positioned on one surface of the display panel. The base film includes a first layer and a second layer overlapping each other, and a metal layer positioned between the first layer and the second layer. A modulus of each of the first layer and the second layer is 1 GPa to 10 GPa.

Each of the first layer and the second layer may include at least one of polyimide, polyphenylene sulfide, polyethylene naphthalate, and polyaryletherketone.

The metal layer may include at least one of Invar®, stainless steel, titanium, and copper.

A thickness of the metal layer may be greater than a sum of thicknesses of the first layer and the second layer.

A thickness of the metal layer may be 20 μm to 30 μm.

A thickness of each of the first layer and the second layer may be 7 μm to 15 μm.

The first layer and the second layer may include a same material.

The first layer and the second layer may include different materials.

The metal layer may include a first metal layer and a second metal layer, and a third layer positioned between the first metal layer and the second metal layer. The first metal layer may be positioned between the first layer and the third layer. The second metal layer may be positioned between the second layer and the third layer.

The first metal layer and the second metal layer may include a same material.

The first metal layer and the second metal layer may include different materials.

The display device may be flexible. The display device may be bendable in respective directions in which the display panel is compressible and stretchable.

The display panel may be a light emitting display panel or a liquid crystal display panel.

The metal layer may include Invar®, and the first layer and the second layer may include polyimide.

The metal layer includes Invar®, the first layer may include polyimide, and the second layer may include polyaryletherketone.

There may not be an adhesive layer positioned between the metal layer and the first layer or between the metal layer and the second layer. A reactive group on a surface of the metal layer may be directly bonded to reactive groups on surfaces of the first layer and the second layer.

Embodiments are also directed to manufacturing method of a base film, the manufacturing method including preparing a metal layer, positioning a first layer and a second layer at opposite sides of the metal layer, activating reactive groups on surfaces of the metal layer, the first layer, and the second layer by supplying plasma between the metal layer and the first layer and between the metal layer and the second layer, and bonding the first layer, the metal layer, and the second layer by applying pressure to the first layer, the metal layer, and the second layer, wherein a modulus of each of the first layer and the second layer is 1 GPa to 10 GPa.

Each of the first layer and the second layer may include at least one of polyimide, polyphenylene sulfide, polyethylene naphthalate, and polyaryletherketone. The metal layer may include at least one of Invar®, stainless steel, titanium, and copper.

In activating the reactive groups on the surfaces of the metal layer, the first layer, and the second layer by supplying the plasma between the metal layer and the first layer and between the metal layer and the second layer, —OH or —COOH groups positioned on the surfaces of the first layer, the metal layer, and the second layer may be activated.

In bonding the first layer, the metal layer, and the second layer by applying the pressure to the first layer, the metal layer, and the second layer, —OH groups of layers contacting each other may react to form —O— bonds, or —OH and —COOH groups of layers contacting each other may react to form —COO— bonds.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
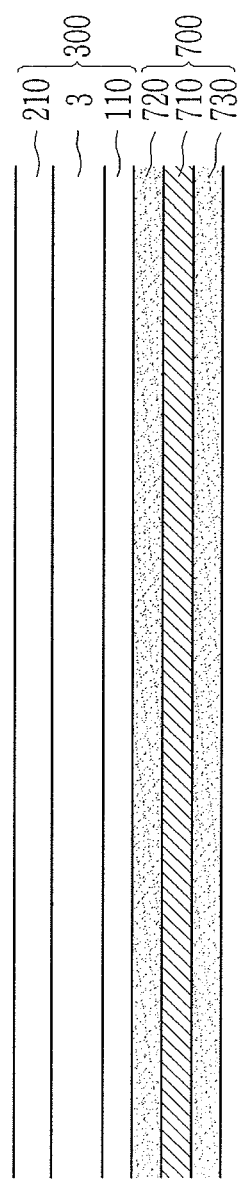
FIG. 1 schematically illustrates a cross-sectional view of a display device according to an exemplary embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

FIG. 1 schematically illustrates a cross-sectional view of a display device according to an exemplary embodiment. Referring to FIG. 1, a display device according to an exemplary embodiment includes a base film 700 having a multi-layered structure, and a display panel 300 positioned on the base film.

Figure 9:
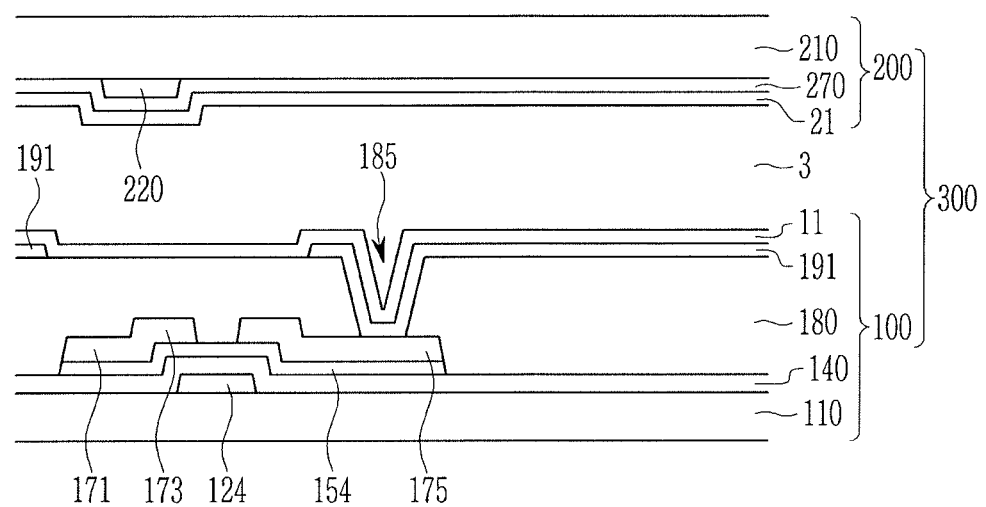
FIG. 9 illustrates a cross-sectional view taken along line IX-IX' of the display device of FIG. 8.
Figure 10:
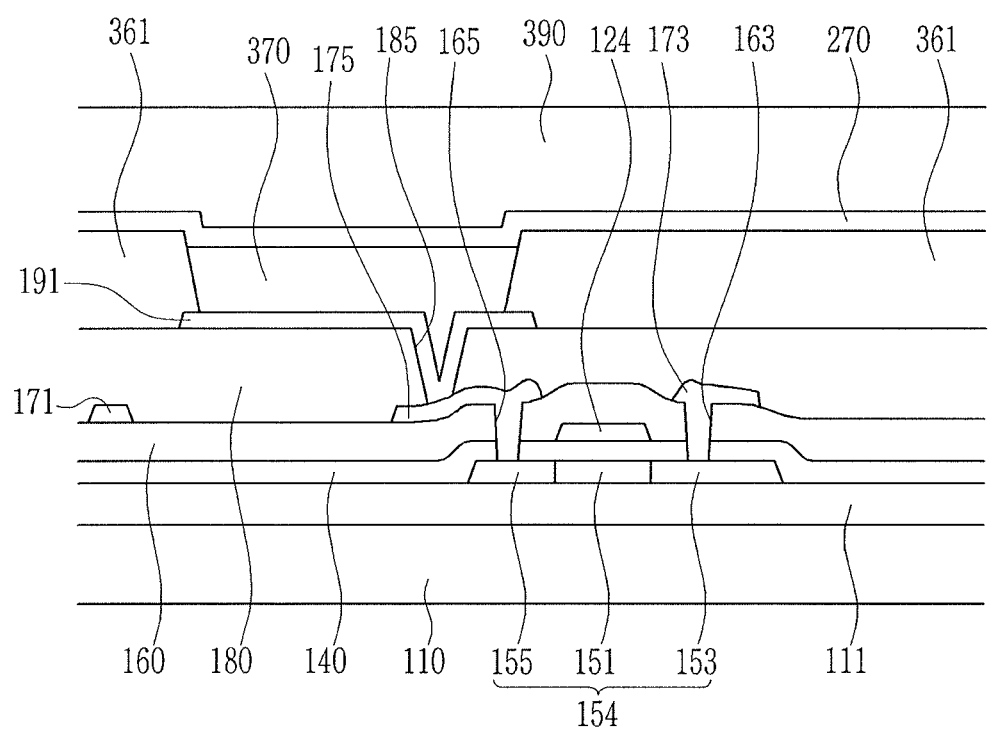
FIG. 10 illustrates a cross-sectional view of a display panel according to an exemplary embodiment.

Referring to FIG. 1, the display panel 300 in some implementations may include a first substrate 110, a second substrate 210 overlapping the first substrate, and a liquid crystal layer 3 positioned between the first and second substrates. In some implementations, the display panel 300 may be an emissive display device including light-emitting elements and not including the liquid crystal layer 3. The display panel 300 may include the first substrate 110 in which a transistor or the like are positioned. As will be described in detail below, the display panel 300 in some implementations may have a cross-sectional structure as shown in FIG. 9 or FIG. 10.

Referring to FIG. 1, the base film 700 may include a metal layer 710, and a first layer 720 and second layer 730 positioned at opposite sides of the metal layer 710. The metal layer 710 may include, for example, at least one of Invar®, stainless steel, titanium, and copper.

Figure 6:
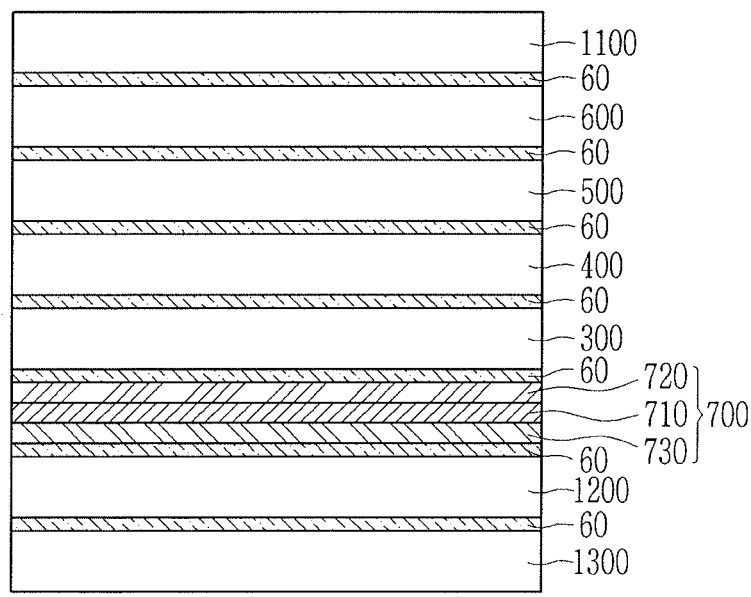
FIG. 6 schematically illustrates an entire stacked structure of a display device according to an exemplary embodiment.

The base film 700 may be positioned to be adjacent to the display panel 300. The base film 700 may include the metal layer 710 to balance the display device. The display device may include, a polarizer 400, a touch panel 500, a window 600, and a passivation film 1100 that are positioned on the display panel 300, as shown in FIG. 6 and described in more detail below. In contrast, when only a jig 1300 or a cover panel 1200 is positioned below the display panel 300, a lower portion of the display device may not have a structure with a high modulus or a thick thickness. Therefore, upper and lower portions of the display device may be unbalanced based on the display panel 300. In this case, when the display device is bent, a large amount of stress may be applied to the display panel 300, and thus a transistor or the like positioned on the display panel 300 may be susceptible to damage.

However, the display device according to the exemplary embodiment includes the base film 700, which includes the metal layer 710, positioned below the display panel 300. The metal layer 710 may have a high modulus of 50 GPa or more. Accordingly, the upper and lower portions of the display device may be balanced with respect to the display panel 300. By adding the metal layer 710, the display panel 300 may become a central layer of the display device. Accordingly, by positioning the base film 700 including the metal layer 710 below the display panel 300, the display panel may become the layer to which stress is minimally applied when the display device is bent, thereby preventing the display panel 300 from being damaged due to bending.

The metal layer 710 included in the base film 700 may include a material having a high modulus in order to balance with the upper structure of the display panel 300. For example, the metal layer 710 may include a material having a modulus of 50 GPa or more. The metal layer 710 may include at least one of Invar®, stainless steel, titanium, and copper, as examples. Among them, Invar®, which is an alloy of iron and nickel, specifically, an alloy having 63.5% of iron and 36.5% of nickel has a small thermal expansion coefficient. Invar® is desirable as a material of the metal layer 710 because it is easy to process in a form of a metal layer, has a high modulus (58.8 GPa), and has a moisture absorption rate of 0%.

The metal layer 710 may serve not only to balance the display device, but also to support the display panel 300 and to prevent damage from external impact. However, if the base film 700 were to be formed as a single layer including only the metal layer 710, stress could be concentrated on the metal layer 710 when the display device is repeatedly bent and the metal layer 710 could be broken.

However, the base film 700 of the display device according to the exemplary embodiment includes the metal layer 710, and the first layer 720 and the second layer 730, including a polymer material, contacting opposite sides of the metal layer 710, and the first layer 720 and the second layer 730. The first layer 720 and the second layer 730 may include a general polymer material. As examples, the first layer 720 and the second layer 730 may include at least one of polyimide, polyphenylene sulfide, polyethylene naphthalate, and polyaryletherketone.

The first layer 720 and the second layer 730 including such a polymer material, may prevent the base film 700 including the metal layer 710 from being broken when the display device is bent, for example, in a region that is repeatedly bent. The first layer 720 and the second layer 730 including the polymer material may increase the yield strain at which the base film begins to break, thereby preventing damage to the base film even when the display device is repeatedly bent.

A modulus of each polymer material included in the first layer 720 and the second layer 730 may be 1 GPa to 10 GPa. When the modulus of the polymer material respectively included in the first layer 720 and the second layer 730 is more than 1 GPa, the effect of preventing the damage of the metal layer 710 according to the addition of the first layer 720 and the second layer 730 may be sufficient. When the modulus of the polymer material included in the first layer 720 and the second layer 730 is less than 10 GPa, the elasticity of the first layer 720 and the second layer 730 may be maintained. That is, a situation may be avoided wherein the first layer 720 and the second layer 730 fail to absorb the impact of the base film 700 and are broken together with the metal layer 710. Therefore, the modulus of the polymer material respectively included in the first layer 720 and the second layer 730 may be 1 GPa to 10 GPa.

In an exemplary embodiment, a thickness of the metal layer 710 may be 20 μm to 30 μm. Thicknesses of the first layer 720 and the second layer 730 may be 7 μm to 15 μm, respectively. In an exemplary embodiment, the thickness of the metal layer 710 may be greater than a sum of the thicknesses of the first layer 720 and the second layer 730. When the thickness of the metal layer 710 is greater than the sum of the thicknesses of the first layer 720 and the second layer 730, structural reinforcement of the display panel 300 by the base film 700 may be sufficiently achieved. In addition, in the display device according to an exemplary embodiment a position of the central layer of the display device is at the display panel 300 because of the base film 700 including the metal layer 710. When the thickness of the metal layer 710 is greater than the sum of the thicknesses of the first layer 720 and the second layer 730, a position of the central surface may be maintained.

In the base film 700 according to an exemplary embodiment, the metal layer 710 and the first layer 720, and the metal layer 710 and the second layer 730, are directly bonded without adhesive or an adhesive layer therebetween. For example, an adhesive layer or adhesive may be omitted between the metal layer 710 and the first layer 720 or between the metal layer 710 and the second layer 730.

In the base film 700 according to an exemplary embodiment, the metal layer 710, the first layer 720, and the second layer 730 may be combined by surface activated bonding, which is a method of bonding substrates by supplying a plasma between both substrates to activate reactors such as —OH or —COOH groups on surfaces of both substrates, and then pressing both substrates against each other with a strong pressure to allow the activated reactors to be bonded to each other. For example, in an exemplary embodiment, the —OH groups positioned on the surface of the metal layer 710 may be directly bonded to the —OH groups positioned on the surfaces of the first layer 720 and the second layer 730.

As described above, the base film 700 may not include an adhesive layer or adhesive. Accordingly, it may be possible to prevent physical properties of the base film 700 from being changed due to the presence of an adhesive layer or an adhesive. It may be possible to prevent the central layer of the display device from being moved due to the presence of an adhesive layer or an adhesive. For example, if an adhesive layer were to be included therein, characteristics of the base film 700 could be changed at an interface between the adhesive layer and the metal layer 710 and at an interface between the adhesive layer and the first layer 720 or the second layer 730. When the display device according to an exemplary embodiment does not include an adhesive layer, it may be possible to prevent undesirable issues resulting from the presence of an adhesive layer.

The display device according to an exemplary embodiment may be a flexible display device. For example, the display device according to an embodiment may be a display device that is bendable in upward and downward directions of the display panel.

Figure 2A:
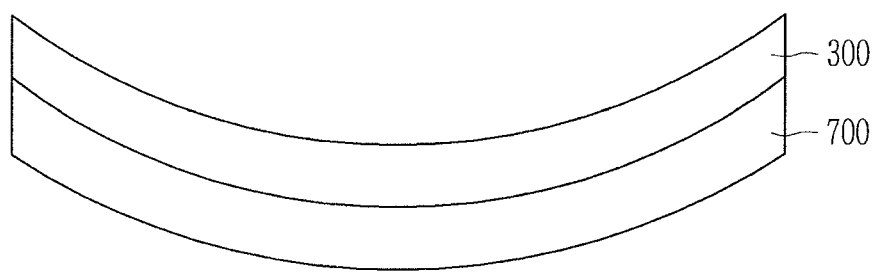
FIGS. 2A and 2B illustrate a flexible display device according to an exemplary embodiment.
Figure 2B:
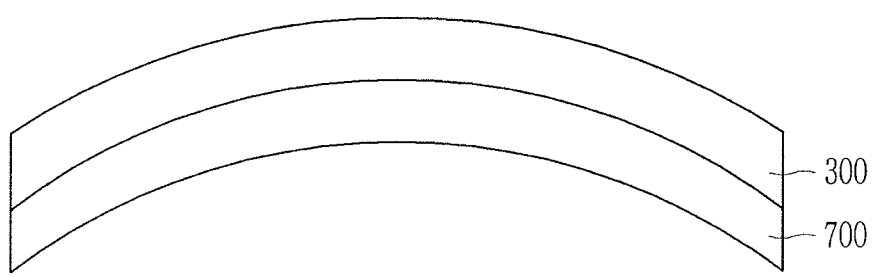

FIG. 2A and FIG. 2B illustrate a flexible display device according to an exemplary embodiment. FIG. 2A illustrates a shape in which the flexible display device is bent in a direction in which the display panel 300 is compressed, and FIG. 2B illustrates a shape in which the flexible display device is bent in a direction in which the display panel 300 is stretched. For example, as shown in FIG. 2A and FIG. 2B, the display panel 300 of the display device according to an exemplary embodiment may be bendable in opposite directions, including the stretched direction and the compressed direction.

In this case, stress may accumulate in the metal layer 710 of the base film 700 due to repeated bending in the opposite directions. However, in the display device according to an exemplary embodiment, by positioning the first layer 720 and the second layer 730 including the polymer material at opposite sides of the metal layer 710 of the base film 700, it may be possible to increase the yield strain at which the base film 700 is broken and to prevent the base film 700 from being damaged.

Figure 3:
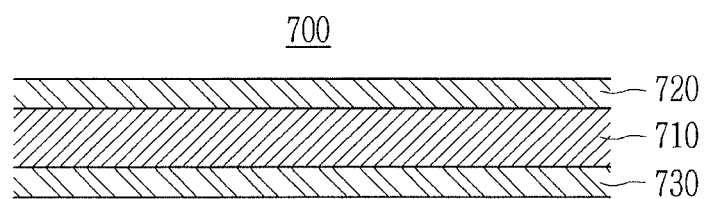
FIG. 3 and FIG. 4 separately illustrate a base film from a display device according to an exemplary embodiment.
Figure 4:
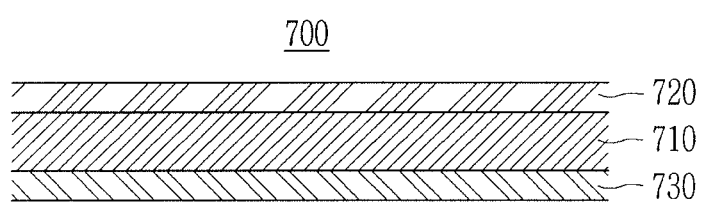

FIG. 3 and FIG. 4 separately illustrate a base film 700 from a display device according to an exemplary embodiment. Referring to FIG. 3, the first layer 720 and the second layer 730 of the base film 700 may include the same material. For example, the base film 700 may include Invar®, and the first layer 720 and the second layer 730 may include polyimide. As another example, the base film 700 may include Invar®, and the first layer 720 and the second layer 730 may include polyetheretherketone.

Referring to FIG. 4, the first layer 720 and the second layer 730 of the base film 700 may include different materials. For example, the metal layer 710 may include Invar®, the first layer 720 may include polyimide, and the second layer 730 may include polyetheretherketone. When a direction in which the flexible display device is mainly bent is specified, stress and strain may be appropriately adjusted in the stretched layer and the compressed layer by including polymer materials having different moduli in the first layer 720 and the second layer 730.

For example, when a polymer material having a high modulus is included in a layer positioned on an outside with respect to a bending direction, for example, a layer to which a tension force is applied, and when a polymer material having a low modulus is included in a layer positioned at an inside of the bending direction, that is, a layer to which compressive stress is applied, it may be possible to effectively prevent the base film 700 from being broken.

Figure 5:
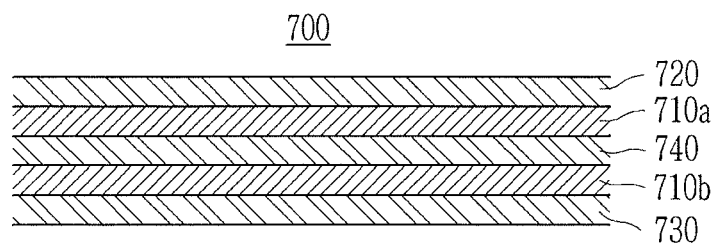
FIG. 5 illustrates a base film of a display device according to an exemplary embodiment.

FIG. 5 illustrates a base film 700 of a display device according to another exemplary embodiment. Referring to FIG. 5, in the base film 700 according to an exemplary embodiment, the metal layer may include a first metal layer 710a and a second metal layer 710b. A polymer layer may include the first layer 720 positioned on one surface of the first metal layer 710a, the second layer 730 positioned on one surface of the second metal layer 710b, and a third layer 740 positioned between the first metal layer 710a and the second metal layer 710b. The metal layers 710a and 701b and the first layer to the third layer 720, 730, and 740 may have the same composition as the first and second layers 720 and 730 and the metal layer 710 as described above. The detailed description of the same constituent elements will not be repeated.

The base film according to the embodiment of FIG. 5 may have a five-layer structure of a polymer-metal-polymer-metal-polymer, in contrast to the base film according to the previous embodiment, which was a three-layer structure of a polymer-metal-polymer. The first metal layer 710a and the second metal layer 710b may include the same material, or may include different materials. Similarly, the first layer 720, the second layer 730, and the third layer 740 may include the same material, or may include different materials. Similar to FIG. 4, in the base film according to the embodiment of FIG. 5, the materials with different moduli may be sequentially included in respective layers according to anticipated bending directions. For example, when the base film 700 is more likely to be bent in the direction in which the first layer 720 is compressed, the polymer material may be included such that the moduli increase in an order of the first layer 720, the third layer 740, and the second layer 730. Similarly, in the metal layer, a material having a greater modulus than in the first metal layer 710a may be included in the second metal layer 710b. When the base film 700 is more likely bent in the direction in which the second layer 730 is compressed, the layers of the base film may be opposite to the above description.

FIG. 6 schematically illustrates an entire stacked structure of a display device according to an exemplary embodiment. Referring to FIG. 6, a display device according to an exemplary embodiment may include a jig 1300 for fixing the display device, a cover panel 1200 positioned on the jig and having a cushion structure, the base film 700 positioned on the cover panel 1200, the display panel 300 positioned on the base film 700, the polarizer 400 positioned on the display panel, the touch panel 500 positioned on the polarizer, the window 600 positioned on the touch panel 500, and the passivation film 1100 positioned on the window. The respective constituent elements may be bonded to each other by an adhesive layer 60.

A stacked order of the constituent elements may vary from what is described above, and some of the constituent elements may be omitted. Referring to FIG. 6, the display panel 300 may be positioned in a central region of the display device due to the presence of the base film 700. The base film 700 includes the metal layer 710 with a high modulus, such that the central layer of the display device may be positioned in the display panel 300. Moreover, the first layer 720 and the second layer 730 including the polymer material may be positioned at opposite sides of the metal layer 710, thereby helping to prevent the metal layer 710 from being broken due to repeated bending.

Table 1 shows measured yield strains when the base film is formed as a single metal layer including Invar®.

TABLE 1

|  | Measured value of single Invar | |
| --- | --- | --- |
|  | 40 μm | 30 μm |
| Strain (@R3) | 1.1% | 1.7% |

Figure 7:
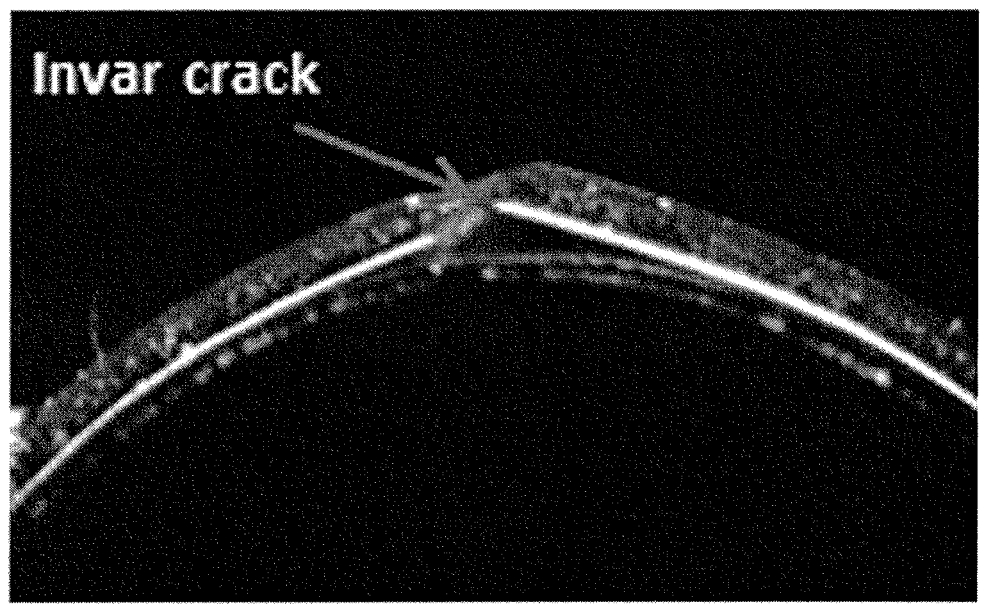
FIG. 7 illustrates an image of an Invar® film in which a crack has occurred.

Referring to Table 1, when the base film was bent at a curvature (@ R3) of 3 mm, it can be seen that the Invar® film having a thickness of 40 μm cracked at a strain of 1.1% and the Invar® film having a thickness of 30 μm cracked at a strain of 1.7%. FIG. 7 illustrates an image of the cracked Invar® film.

Table 2 shows measured moduli and yield strains of the base film made of an Invar® monolayer (Comparative Example 1), and moduli and yield strains of the base film made of a polyimide/Invar®/polyimide triple layer (Exemplary Embodiment 1).

TABLE 2

| Base film 30 μm | Modulus [GPa] | Yield strain [%] |
| --- | --- | --- |
| Comparative Example 1 (Invar) | 58.86 | 1.86 |
| Exemplary Embodiment 1 (PI/Invar/PI) | 66.17 | 2.21 |

Referring to Table 2, it was confirmed that the modulus and the yield strain value increased at the same thickness in Example 1 compared with Comparative Example 1. For example, by positioning the polyimide layer on the opposite sides of the Invar® film, it was confirmed that mechanical properties thereof were improved as compared with those of the Invar® monolayer.

The display panel 300 described above may be a liquid crystal display panel or a light emitting display panel, as examples. The display panel 300 may include the first substrate 110. When the display device is a flexible display device, the first substrate 110 may be flexible.

Hereinafter, a specific structure in which the display panel 300 may be included will be described with reference to the accompanying drawings.

Figure 8:
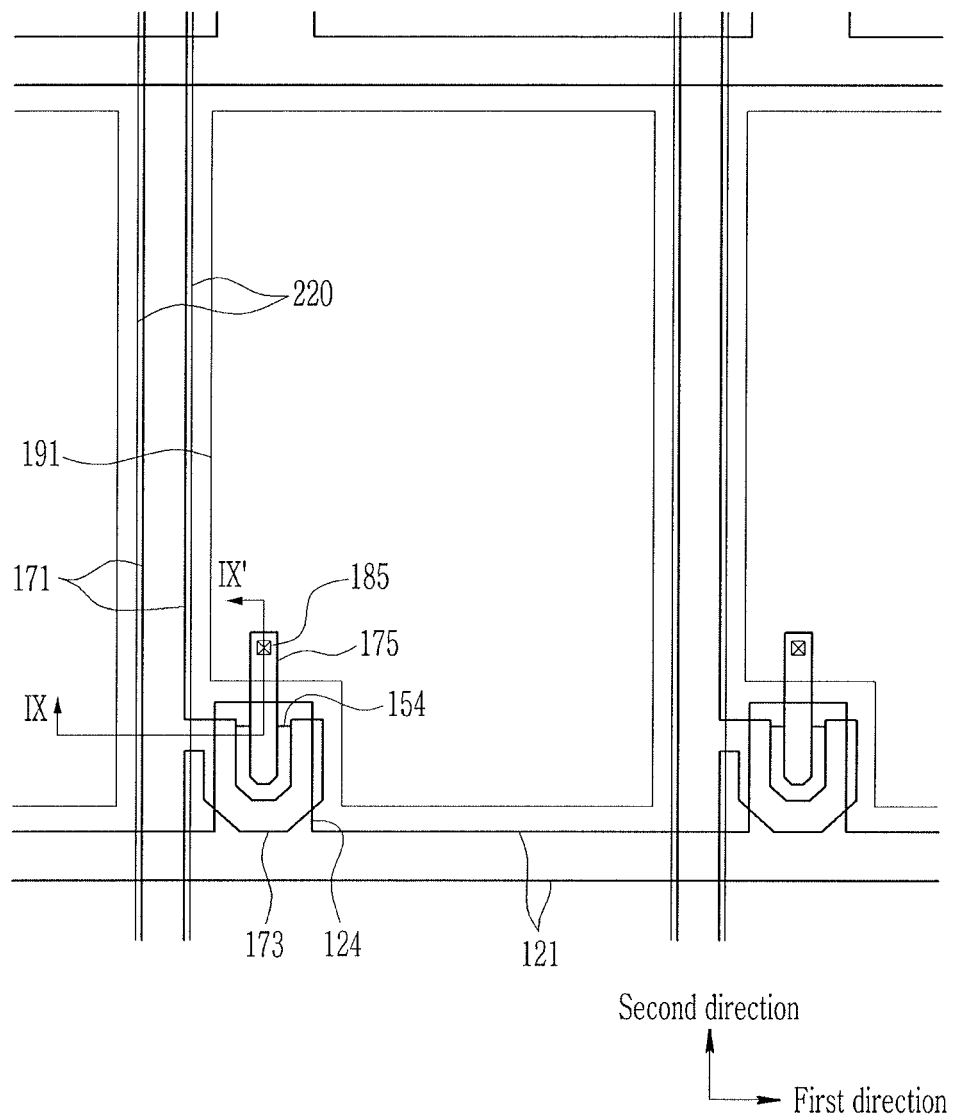
FIG. 8 illustrates a layout view of a display panel according to an exemplary embodiment.

FIG. 8 illustrates a layout view of a display panel according to an exemplary embodiment, and FIG. 9 illustrates a cross-sectional view taken along line IX-IX' of the display device of FIG. 8.

Referring to FIG. 8 and FIG. 9, the display panel 300 includes a first display panel 100, a second display panel 200 overlapping the first display panel 100, and the liquid crystal layer 3 positioned between the first display panel 100 and the second display panel 200.

The first display panel 100 may include a gate conductor including a gate line 121 and a gate electrode 124 positioned on one surface of the first substrate 110. The first substrate 110 may be made of transparent glass or plastic.

The gate line 121 may extend in a first direction. The gate conductor may include a suitable metal or conductor, and may have a multi-layered structure. A gate insulating layer 140 may be positioned between the gate conductor and the liquid crystal layer 3. The gate insulating layer 140 may include an inorganic insulating material.

A semiconductor layer 154 may be positioned on one surface of the gate insulating layer 140.

A data line 171 may be positioned between the semiconductor layer 154 and the liquid crystal layer 3. The data line 171 may extend in a second direction to cross the gate line 121. A source electrode 173 may extend from the data line 171 and may overlap the gate electrode 124. A drain electrode 175 may be separated from the data line 171. As shown in FIG. 8, the drain electrode may be rod-shaped and extend toward a center of the source electrode 173.

Some of the semiconductor layer 154 may not overlap the data line 171 and the drain electrode 175 in a region between the source electrode 173 and the drain electrode 175. The semiconductor layer 154 may have substantially the same planar shape as the data line 171 and the drain electrode 175 except for the non-overlapping portion.

One gate electrode 124, one source electrode 173, and one drain electrode 175 may form one thin film transistor together with the semiconductor layer 154. A channel of the thin film transistor may correspond to a region of the semiconductor layer 154 between the source electrode 173 and the drain electrode 175.

A passivation layer 180 may be positioned between the source electrode 173 and drain electrode 175, and the liquid crystal layer 3. The passivation layer 180 may include an inorganic insulating material, an organic insulating material, a low dielectric insulating material, etc., such as a silicon nitride or a silicon oxide.

The passivation layer 180 may be provided with a contact hole 185 overlapping some of the drain electrode 175.

A first electrode 191 may be positioned between the passivation layer 180 and the liquid crystal layer 3. The first electrode 191 may be physically and electrically connected to the drain electrode 175 through the contact hole 185. The first electrode 191 may receive a data voltage from the drain electrode 175. The first electrode 191 may be a pixel electrode.

A first alignment layer 11 may be positioned between the first electrode 191 and the liquid crystal layer 3.

The second display panel 200 may include the second substrate 210, a light blocking member 220, a second electrode 270, and a second alignment layer 21.

The second electrode 270 may be positioned on one surface of the second substrate 210. The second electrode 270 may be a common electrode.

The light blocking member 220 may be positioned between the second substrate 210 and the second electrode 270. The light blocking member 220 may overlap the data line 171 to extend in the second direction. The light blocking member may further include a horizontal portion overlapping the gate line 121 and extending in the first direction. In some implementations, the light blocking member 220 may be omitted.

The second alignment layer 21 may be positioned between the second electrode 270 and the liquid crystal layer 3.

Hereinafter, a display device according to another exemplary embodiment will be described in detail with reference to FIG. 10.

FIG. 10 illustrates a cross-sectional view of a display panel according to an exemplary embodiment. Referring to FIG. 10, a buffer layer 111 made of a silicon oxide or a silicon nitride may be positioned on the first substrate 110.

A semiconductor layer 154 may be positioned on the buffer layer 111. The semiconductor layer 154 may include a source region 153 and a drain region 155 doped with a p-type impurity, and a channel region 151 positioned between the source region 153 and the drain region 155.

A gate insulating layer 140 may be positioned on the semiconductor layer 154 and the buffer layer 111. The gate insulating layer 140 may include a silicon oxide or a silicon nitride. The gate electrode 124 may overlap the channel region 151 of the semiconductor layer 154 and may be positioned on the gate insulating layer 140.

An interlayer insulating layer 160 may be positioned on the gate electrode 124 and the gate insulating layer 140. The interlayer insulating layer 160 may be provided with a first contact hole 165 and a second contact hole 163.

A data conductor including a data line 171, a source electrode 173, and a drain electrode 175 may be positioned on the interlayer insulating layer 160.

The drain electrode 175 may be connected to the drain region 155 through the first contact hole 165. The source electrode 173 may be connected to the source region 153 through the second contact hole 163.

A passivation layer 180 may be positioned on the data conductors 171, 173, and 175 and the interlayer insulating layer 160. The passivation layer 180 may be provided with a contact hole 185.

The first electrode 191 may be positioned on the passivation layer 180. The first electrode 191 may be a pixel electrode. The first electrode 191 may be connected to the drain electrode 175 through the contact hole 185. A partition wall 361 may be positioned on the passivation layer 180. A light-emitting diode layer 370 may be positioned to overlap the first electrode 191, and the second electrode 270 is positioned to overlap the light-emitting diode layer 370. The second electrode 270 may be a common electrode.

The first electrode 191 may be an anode, which is a hole injection electrode, and the second electrode 270 may be a cathode, which is an electron injection electrode. In some implementations, according to a driving method of the display device, the first electrode 191 may be a cathode and the second electrode 270 may be an anode.

The light-emitting diode layer 370 may include an emission layer, an electron transporting layer, a hole transporting layer, etc.

An encapsulation layer 390 may be positioned to overlap the second electrode 270. The encapsulation layer 390 may include an organic material or an inorganic material, or may include the organic material and the inorganic material that are alternately stacked. The encapsulation layer 390 may protect the display device from external moisture, heat, and other pollutants.

As described above, the display device according to the exemplary embodiment may include the base film 700 positioned at a lower portion of the display panel 300. The base film 700 may have a structure in which the metal layer 710 is positioned between the first layer 720 and the second layer 730 including the polymer material. Accordingly, the display panel 300 may be located in a central layer of the display device due to the presence of the metal layer 710, and damage to the display panel 300 is minimized even when the display device is bent. The first layer 720 and the second layer 730 including the polymer material may be positioned at the opposite sides of the metal layer 710, of the display device, thereby helping to prevent the metal layer 710 from being damaged by the bending of the display device.

Hereinafter, a manufacturing method of the base film according to the exemplary embodiment will be described with reference to the accompanying drawings. FIG. 11 to FIG. 15 illustrate manufacturing processes of the base film according to the exemplary embodiment.

Figure 11:
FIG. 11 to FIG. 15 illustrate manufacturing processes of a base film according to an exemplary embodiment.

Referring to FIG. 11, the metal layer 710 may be formed. The metal layer 710 may include at least one of Invar®, stainless steel, titanium, and copper. The thickness of the metal layer 710 may be 20 μm to 30 μm.

Figure 12:
Figure 12:
Figure 12:
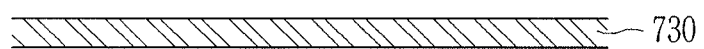

Referring to FIG. 12, the first layer 720 and the second layer 730 may be respectively positioned at upper and lower portions of the metal layer 710. Each of the first layer 720 and the second layer 730 may include a polymer material. The modulus of the polymer material included in each of the first layer 720 and the second layer 730 may be 1 GPa to 10 GPa. The thickness of each of the first layer 720 and the second layer 730 may be 7 μm to 15 μm. The first layer 720 and the second layer 730 may include at least one of polyimide, polyphenylene sulfide, polyethylene naphthalate, and polyaryletherketone. The first layer 720 and the second layer 730 may include the same material, or may include different materials.

Figure 13:
Figure 13:
Figure 13:
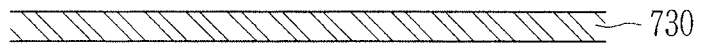

Referring to FIG. 13, plasma may be supplied between the metal layer 710 and the first layer 720 and between the metal layer 720 and the second layer 730 to activate the surfaces of the metal layer 710, the first layer 720, and the second layer 730. By supplying the plasma, —COOH groups or —OH groups positioned on the surface of the metal layer 710, the first layer 720, and the second layer 730 may be activated.

Figure 14:
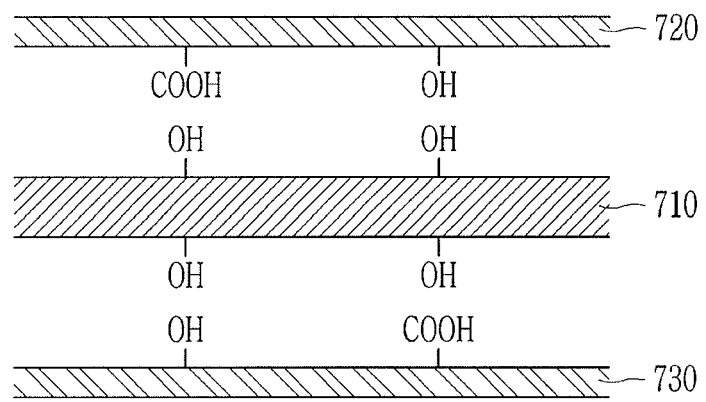

FIG. 14 schematically illustrates the activated surfaces of the metal layer 710, the first layer 720, and the second layer 730. FIG. 14 exemplarily illustrates some reactive groups.

Figure 15:
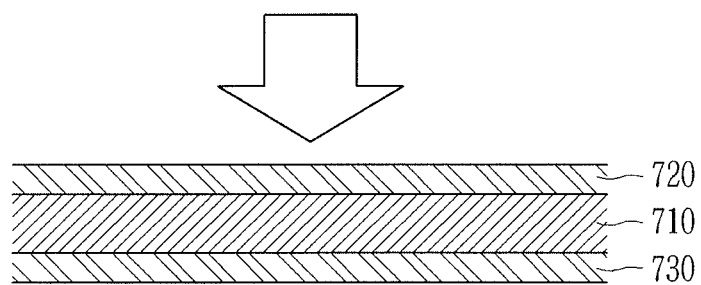

Referring to FIG. 15, pressure may be applied to the surfaces of the metal layer 710, the first layer 720, and the second layer 730 that are activated in FIG. 14. The pressure may cause the activated reactive groups, for example, —COOH groups and —OH groups, to react and bind with each other on the surfaces of the metal layer 710, the first layer 720, and the second layer 730.

Reaction equations may be as follows.

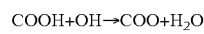

$$COOH + OH \rightarrow COO + H_2O$$

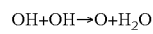

$$OH + OH \rightarrow O + H_2O$$

For example, the metal layer 710 and the first layer 720, and the metal layer 710 and the second layer 730, may be bonded to each other without an adhesive layer or an adhesive by the reaction equations. Therefore, the base film 700 may be manufactured by bonding the first layer 720, the metal layer 710, and the second layer 730 to each other without an adhesive or an adhesive layer.

Figure 16:
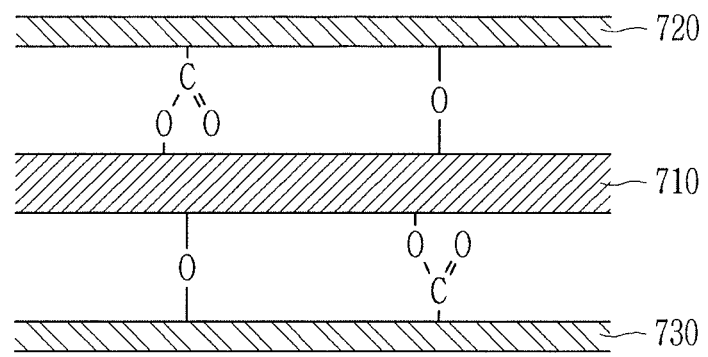
FIG. 16 illustrates a combination principle between a metal layer and a first layer and between a metal layer and a second layer according to a manufacturing method.

FIG. 16 illustrates a combination principle between the metal layer 710 and the first layer 720 and between the metal layer 710 and the second layer 730 according to the manufacturing method. As shown in FIG. 16, —OH or —COOH groups activated by the plasma may react with —OH or —COOH groups in an adjacent layer by the pressure to form —COO— bonds or —O— bonds. consequently, adjacent layers may be bonded to each other without a separate adhesive layer.

According to the manufacturing method of the base film, the metal layer 710 may be bonded to the first layer 720 and the second layer 730 without using an adhesive layer or an adhesive, which is economical. In addition, if an adhesive or adhesive layer were to be used, the characteristics of the base film 700 could be changed or the central layer of the display device to which the base film 700 is applied could be changed due to the presence of the adhesive or adhesive layer. However, this issue may be avoided because the base film 700 according to the present exemplary embodiment does not have the adhesive or adhesive layer.

By way of summation and review, display devices have been developed for various types of information transfer in modern society. Recently, many technical challenges have been addressed in terms of weight and thickness of a display device as display devices move away from flat-panel light emission.

As one of the flat panel displays, the liquid crystal display is currently most widely used. The liquid crystal display is a non-emissive display device that uses a separate light source such as a backlight. Recently, an organic light emitting diode (OLED) display that is a self-luminous display device has received attention. The organic light emitting diode display includes two electrodes facing each other, and an organic layer interposed between the electrodes. In the organic light emitting diode display, if holes injected from an anode and electrons injected from a cathode meet each other at a light emitting layer to generate an exciton and the exciton is subjected to photo-luminescence quenching, light is generated. The organic light emitting diode display may be applied to various fields including a display device and a lighting device.

In this organic light emitting diode display or liquid crystal display, a flexible display device can be configured by using a bendable substrate. In this case, constituent elements such as pixels and/or wires formed in the flexible display device may have bent or folded portions which may be deformed or of which the characteristics may be deteriorated due to stress.

Embodiments provide a display device that reduces damage when the display device is bent and a method of manufacturing a base film without using an adhesive layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:
1. A display device, comprising:
a base film that includes:
a metal layer having a planar form with a first major surface and a second major surface opposite the first major surface, the metal layer having an integral form such that no internal non-metal layers are between the first major surface and the second major surface;
a first layer made of a polymer material and having an integral form, the first layer directly bonded to the first major surface without adhesive or an adhesive layer therebetween, and a reactive group on the first major surface directly bonded to a reactive group of the first layer; and
a second layer made of a polymer material and having an integral form, the second layer directly bonded to the second major surface without adhesive or an adhesive layer therebetween, and a reactive group on the second major surface directly bonded to a reactive group of the second layer;
a display panel positioned on the first layer, the display panel including a substrate that covers the base film with pixels and a transistor disposed directly between the substrate and the first layer, wherein
a modulus of each of the first layer and the second layer is 1 GPa to 10 GPa,
the metal layer includes a first metal layer and second metal layer, and a third layer positioned between the first metal layer and the second metal layer,
the first metal layer is positioned between the first layer and the third layer, and
the second metal layer is positioned between the second layer and the third layer.
2. The display device as claimed in claim 1, wherein each of the first layer and the second layer includes polyimide, polyphenylene sulfide, polyethylene naphthalate, polyaryletherketone, or a combination thereof.
3. The display device as claimed in claim 1, wherein the metal layer includes an iron-nickel alloy, stainless steel, titanium, copper, or a combination thereof.
4. The display device as claimed in claim 1, wherein a thickness of the metal layer is greater than a thickness of the first layer, and
a thickness of the metal layer is greater than a thickness of the second layer.
5. The display device as claimed in claim 4, wherein a thickness of the metal layer is 20 μm to 30 μm.
6. The display device as claimed in claim 5, wherein a thickness of each of the first layer and the second layer is 7 μm to 15 μm.
7. The display device as claimed in claim 1, wherein the first layer and the second layer include a same material.
8. The display device as claimed in claim 1, wherein the first layer and the second layer include different materials.
9. The display device as claimed in claim 1, wherein the first metal layer and the second metal layer include a same material.
10. The display device as claimed in claim 1, wherein the first metal layer and the second metal layer include different materials.
11. The display device as claimed in claim 1, wherein the display device is flexible, and
the display device is bendable in respective directions in which the display panel is compressible and stretchable.
12. The display device as claimed in claim 1, wherein the metal layer includes an iron-nickel alloy, and
the first layer and the second layer include polyimide.
13. The display device as claimed in claim 1, wherein the metal layer includes an iron-nickel alloy, the first layer includes polyimide, and the second layer includes polyaryletherketone.

14. The display device as claimed in claim 3, wherein the metal layer includes FeNi36.

15. The display device as claimed in claim 1, wherein the metal layer is bonded to the first layer and the second layer via at least one of —O— bonds or —COO— bonds.

16. The display device as claimed in claim 1, wherein the base film further includes:
- a second metal layer having a planar form with a third major surface that faces the second layer and a fourth major surface opposite the third major surface, wherein the second layer is directly bonded to the third major surface without adhesive or an adhesive layer therebetween, and a reactive group on the third major surface is directly bonded to a reactive group of the second layer; and
- a third layer made of a polymer material, the third layer directly bonded to the fourth major surface without adhesive or an adhesive layer therebetween, and a reactive group on the fourth major surface directly bonded to a reactive group of the third layer, wherein a modulus of the third layer is 1 GPa to 10 GPa.

17. A display device, comprising:

a base film that includes:
- a metal layer having a planar form with a first major surface and a second major surface opposite the first major surface, the metal layer having an integral form such that no internal non-metal layers are between the first major surface and the second major surface;
- a first layer made of a polymer material and having an integral form, the first layer directly bonded to the first major surface without adhesive or an adhesive layer therebetween, and a reactive group on the first major surface directly bonded to a reactive group of the first layer; and
- a second layer made of a polymer material and having an integral form, the second layer directly bonded to the second major surface without adhesive or an adhesive layer therebetween, and a reactive group on the second major surface directly bonded to a reactive group of the second layer;
- a display panel positioned on the first layer, the display panel including a substrate that covers the base film with pixels and a transistor disposed directly between the substrate and the first layer, wherein the metal layer includes a first metal layer and a second metal layer, and a third layer positioned between the first metal layer and the second metal layer, the first metal layer is positioned between the first layer and the third layer, and the second metal layer is positioned between the second layer and the third layer.

18. The display device as claimed in claim 17, wherein a thickness of the metal layer is 20 μm to 30 μm.

19. The display device as claimed in claim 18, wherein a modulus of each of the first layer and the second layer is 1 GPa to 10 GPa, and a thickness of each of the first layer and the second layer is 7 μm to 15 μm.

20. The display device as claimed in claim 17, wherein a modulus of each of the first layer and the second layer is 1 GPa to 10 GPa, and a thickness of each of the first layer and the second layer is 7 μm to 15 μm.

* * * * *